United States Patent
Park (10) Patent No.: US 7,791,277 B2
(45) Date of Patent: Sep. 7, 2010

(54) PLASMA DISPLAY PANEL PROVIDED WITH GROUNDING UNITS FOR THE ASSEMBLY OF THE DISPLAY PANEL AND AN ELECTROMAGNETIC INTERFERENCE SHIELDING FLIM

(75) Inventor: Yu Park, Seoul (KR)

(73) Assignee: LG Electronics Inc., Seoul (KR)

( * ) Notice: Subject to any disclaimer, the term of this patent is extended or adjusted under 35 U.S.C. 154(b) by 352 days.

(21) Appl. No.: 11/456,931

(22) Filed: Jul. 12, 2006

(65) Prior Publication Data

US 2007/0018576 A1 Jan. 25, 2007

(30) Foreign Application Priority Data

Jul. 21, 2005 (KR) .................. 10-2005-0066480

(51) Int. Cl.
*H01J 17/49* (2006.01)
*H01J 5/16* (2006.01)
*H01J 17/16* (2006.01)

(52) U.S. Cl. .................. 313/582; 313/110; 313/112; 313/587

(58) Field of Classification Search ......... 313/582–587, 313/110–112
See application file for complete search history.

(56) References Cited

U.S. PATENT DOCUMENTS

| 6,229,085 B1 * | 5/2001 | Gotoh et al. ............... 174/353 |
| 2004/0090182 A1 | 5/2004 | Cha |
| 2004/0165297 A1 | 8/2004 | Kim et al. |
| 2004/0198096 A1 | 10/2004 | Kim |

FOREIGN PATENT DOCUMENTS

| EP | 0 910 107 | 4/1999 |
| EP | 1 267 318 | 12/2002 |
| EP | 1 388 836 | 2/2004 |
| EP | 1 482 331 | 12/2004 |
| JP | 09306366 A * | 11/1997 |
| KR | 2002-0091260 | 12/2002 |
| KR | 1020050074014 | 7/2005 |

OTHER PUBLICATIONS

European Search Reported dated Jan. 18, 2007 issued as Korean Application No. 06011522.7; (9 pages).
Chinese Office Action for 200610087195.3 dated Nov. 28, 2008 (9 pages).

* cited by examiner

*Primary Examiner*—Mariceli Santiago
(74) *Attorney, Agent, or Firm*—Fish & Richardson P.C.

(57) ABSTRACT

Disclosed is a Plasma Display Panel (PDP). According to an example, the PDP includes a panel, a base film in the front surface of the panel, and an Electro Magnetic Interference (EMI) shielding film in the base film. Another example of the PDP includes a panel with a panel grounding unit in the front surface, a base film in the front surface of the panel, an EMI shielding film on the base film, a back cover surrounding the panel, and a grounding unit for electrically connecting the panel grounding unit to the back cover. The panel grounding unit and the grounding unit are connected through a conductive substance. The PDP of this research can protect the panel from being damaged by the grounding unit and reduce production costs. Also, it can increase EMI shielding rate by grounding the EMI absorbed in the EMI shielding film.

12 Claims, 6 Drawing Sheets

PLASMA DISPLAY PANEL PROVIDED WITH GROUNDING UNITS FOR THE ASSEMBLY OF THE DISPLAY PANEL AND AN ELECTROMAGNETIC INTERFERENCE SHIELDING FLIM

FIELD OF THE INVENTION

The present invention relates to a plasma display apparatus. More particularly, it relates to a PDP that can be fabricated at a low production cost by increasing the grounding force of a film filter and reducing the number of base films.

BACKGROUND OF THE INVENTION

A Plasma Display Panel (PDP) displays images including texts and/or graphics by emitting light from a phosphor by 147 nm ultraviolet rays generated when inert mixture gas such as He+Xe, Ne+Xe and He+Ne+Xe is discharged. The PDP is suitable for making a display apparatus thin and large and recent development in the PDP technology provides remarkably improved image quality. Particularly, since a 3-electrode alternating current (AC) surface discharge type PDP has wall charges accumulated in the surface during discharge and it protects electrodes from sputtering generated by the discharge, it has advantages that it requires a low operation voltage and has a long lifespan.

Figure 1:
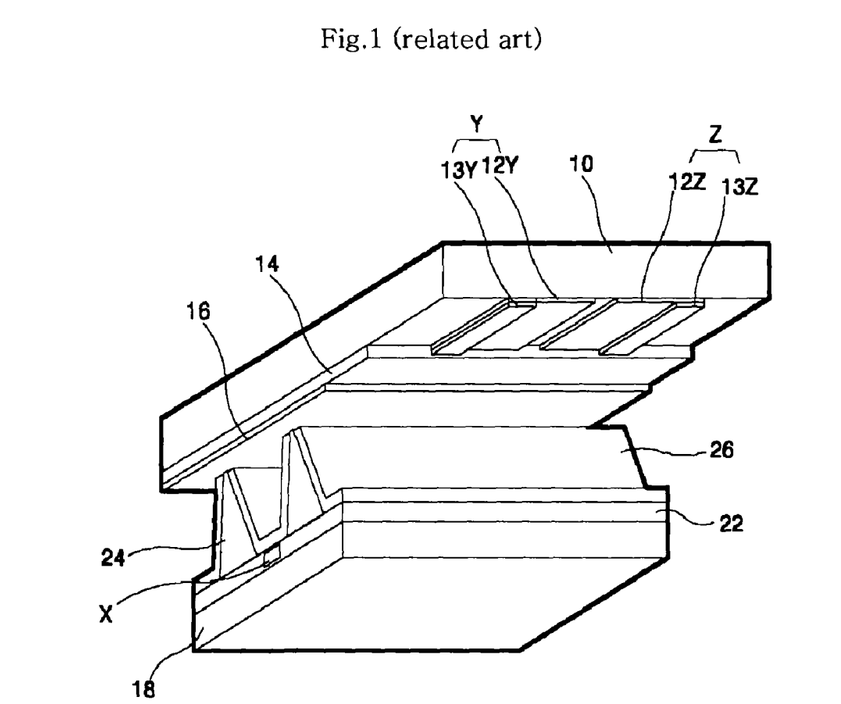
FIG. 1 is a perspective view showing a discharge cell of a conventional Plasma Display Panel (PDP)

FIG. 1 is a perspective view showing a discharge cell of a conventional PDP.

Referring to FIG. 1, the discharge cell of a 3-electrode AC surface discharge type PDP includes a scan electrode Y and a sustain electrode Z which are formed on an upper substrate 10 and an address electrode X formed on a lower substrate 18. Each of the scan electrode Y and the sustain electrode Z includes transparent electrodes 12Y and 12Z and metal bus electrodes 13Y and 13Z having a line width narrower than transparent electrodes 12Y and 12Z and formed in one edge of the transparent electrodes.

The transparent electrodes 12Y and 12Z are generally formed of indium-tin-oxide (ITO) on the upper substrate 10. The metal bus electrodes 13Y and 13Z are generally formed of metal such as Cr on the transparent electrodes 12Y and 12Z and they reduce voltage drop caused by the high-resistance transparent electrodes 12Y and 12Z. The upper substrate 10 with the scan electrode Y and the sustain electrode Z formed in parallel is coated with an upper dielectric layer (14) and a protection layer (16). The wall charges generated from the plasma discharge are accumulated in the upper dielectric layer (14). The protection layer (16) protects the upper dielectric layer (14) from being damaged by the sputtering generated during the plasma discharge and it increases a secondary electron emitting efficiency. Typically, magnesium oxide (MgO) is used to form the protection layer (16).

In the lower substrate 18 with the address electrode X, a lower dielectric layer 22 and a barrier rib 24 are formed. The lower dielectric layer 22 and a barrier rib 24 are coated with a phosphor layer 26. The address electrode X is formed in a direction crossing the scan electrode Y and the sustain electrode Z. The barrier rib 24 is formed in the shape of stripe or lattice and it protects the discharge cell from being exposed to the ultraviolet rays and visible rays generated from the discharge. The phosphor layer 26 is excited by the ultraviolet rays generated from the plasma discharge and produces one of red, green and blue visible rays. The inert gas is injected into a discharge space formed between the upper and lower substrates 10 and 18 and the barrier rib 24.

Each pixel of the PDP includes a discharge cell having the above-described structure and represents gray level by using the visible rays emitted from the discharge cell. The discharge in the PDP causes an Electro Magnetic Interference (EMI). To block the EMI, an EMI filter is formed in the front surface of the PDP. Conventional PDPs have adopted glass filters but recent ones are mostly come with film filters.

Figure 2:
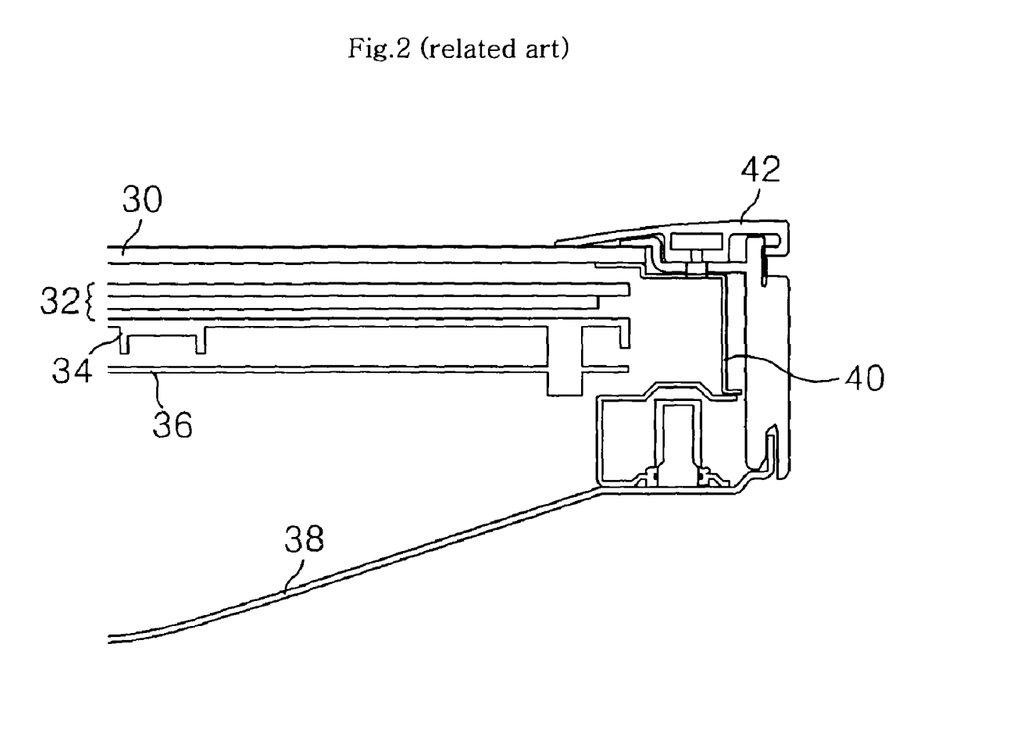
FIG. 2 is a cross-sectional view showing one side of a conventional PDP with a film filter.

FIG. 2 is a cross-sectional view showing one side of a conventional PDP module with a film filter.

Referring to FIG. 2, the conventional PDP module includes a panel 32, a film filter 30, a heat sink 34, a printed circuit board 36, a back cover 38, a filter supporter 40, and a grounding unit 42. The panel 32 is formed by combining the upper substrate 10 and the lower substrate 18. The film filter 30 is mounted on the front surface of the panel 32. The heat sink 34 is set up in the rear surface of the panel 32. The printed circuit board 36 is mounted on the heat sink 34. The back cover 38 is formed to surround the rear surface of the PDP. The filter supporter 40 connects the film filter 30 to the back cover 38. The grounding unit 42 is set up between the film filter 30 and the back cover 38 to surround the filter supporter 40.

The printed circuit board 36 supplies operation signals to the electrodes of the panel 32. It includes many driving units, which are not shown in the drawing, to supply the operation signals. The panel 32 displays a predetermined image in response to the operation signals from the printed circuit board 36. The heat sink 34 emits heat generated from the panel 32 and the printed circuit board 36. The back cover 38 protects the panel 32 form external impact and blocks the EMI emitted to the rear surface of the panel 32.

The filter supporter 40 electrically connects the film filter 30 to the back cover 38. The filter supporter 40 grounds the film filter 30 to the back cover 38 and also prevents the EMI emitted to the sides. The grounding unit 42 supports the filter supporter 40, the film filter 30 and the back cover 38.

The film filter 30 not only blocks the EMI but also prevents external lights from being reflected.

Figure 3:
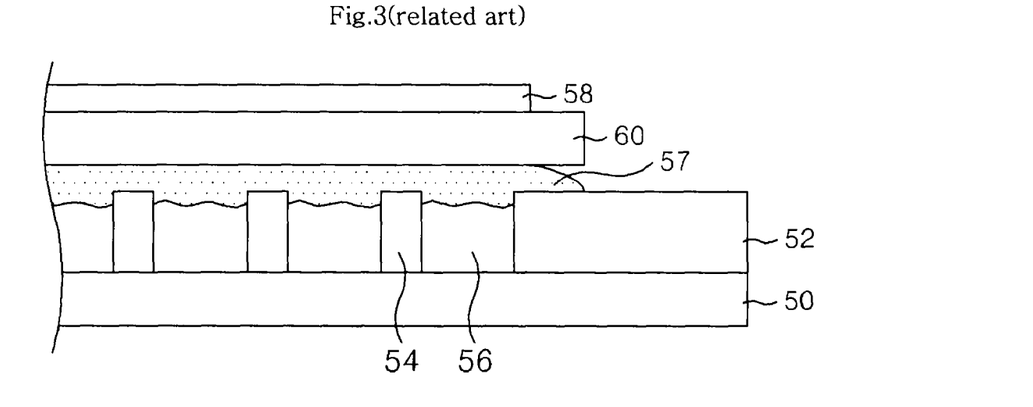
FIG. 3 is a cross-sectional view describing a conventional film filter 30.

FIG. 3 is a cross-sectional view illustrating a structure of a conventional film filter 30.

Referring to FIG. 3, the film-type film filter 30 includes an EMI shielding film 54 formed on a first base film 50. The mesh filter 54 is formed of a conductive metal in a mesh pattern and blocks the EMI.

The mesh filter 54 is typically formed of Ag or Cu and a transparent resin 56 fills the meshes of the mesh filter 54. At the edge of the EMI shielding film 54, a filter grounding unit 52 is formed.

A second base film 60 is formed on the mesh filter 54. The second base film 60 is fixed onto the mesh filter 54 by an adhesive agent 57.

On the second base film 60, a non-reflective layer 58 for preventing external lights from being reflected is formed to clearly display images.

The filter grounding unit 52 is generally formed of the same metal as the mesh filter 54. The filter grounding unit 52, which is a hard metal, becomes a standard for alignment with the panel.

Since the film filter requires two base films to form the non-reflective layer with the mesh filter and ground the EMI blocked out in the mesh filter to the back cover through the filter grounding unit, there are problems that the production cost is high and that the panel structure is complex.

SUMMARY OF THE INVENTION

The present invention is directed to overcome the conventional problems, and an object of the present invention is to provide a Plasma Display Panel (PDP) with a film filter that has an improved grounding structure and requires a less number of base films than a conventional film filter to reduce production costs.

To accomplish the above object, in accordance with an aspect of the present invention, there is provided a PDP which includes a panel, a base film positioned in the front surface of the panel, and an Electro Magnetic Interference (EMI) shielding film formed in the base film. The EMI shielding film is formed toward the panel.

The PDP may further include a non-reflective layer formed in the base film.

Herein, the EMI shielding film includes a filter grounding unit formed at the edge.

Also, the panel includes a panel grounding unit formed in external circumference of an active area of the front surface.

The filter grounding unit and the panel grounding unit are electrically connected.

Also, the PDP may further include a back cover formed to surround the panel, and a grounding unit for electrically connecting the back cover to the panel grounding unit.

In accordance with another aspect of the present invention, there is provided a PDP which includes a panel with a panel grounding unit in the front surface, a base film positioned in the front surface of the panel, an Electro Magnetic Interference (EMI) shielding film formed on the base film toward the panel, a back cover formed to surround the panel, and a grounding unit for electrically connecting the panel grounding unit to the back cover. The panel grounding unit and the grounding unit are connected through a conductive substance.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE INVENTION

Certain embodiments of the present invention will be described in greater detail with reference to the accompanying drawings.

In the following description, same drawing reference numerals are used for the same elements although they appear in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 4:
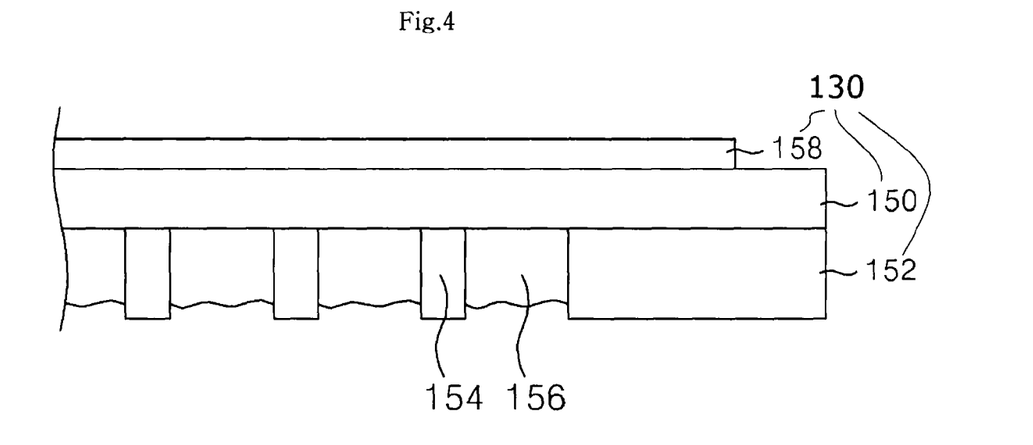
FIG. 4 is a cross-sectional view showing a film filter in accordance with an embodiment of the present invention.
Figure 5A:
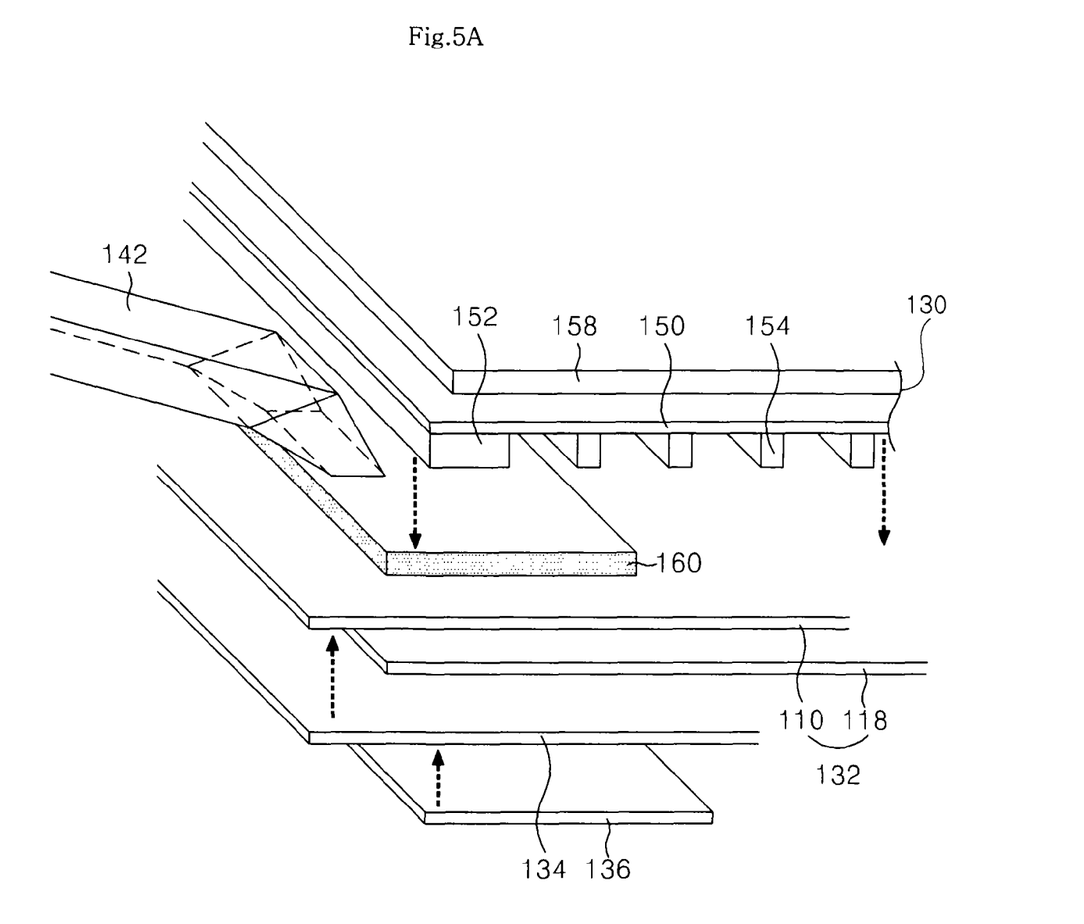
FIG. 5A is a perspective view showing a PDP in accordance with a first embodiment of the present invention.
Figure 5B:
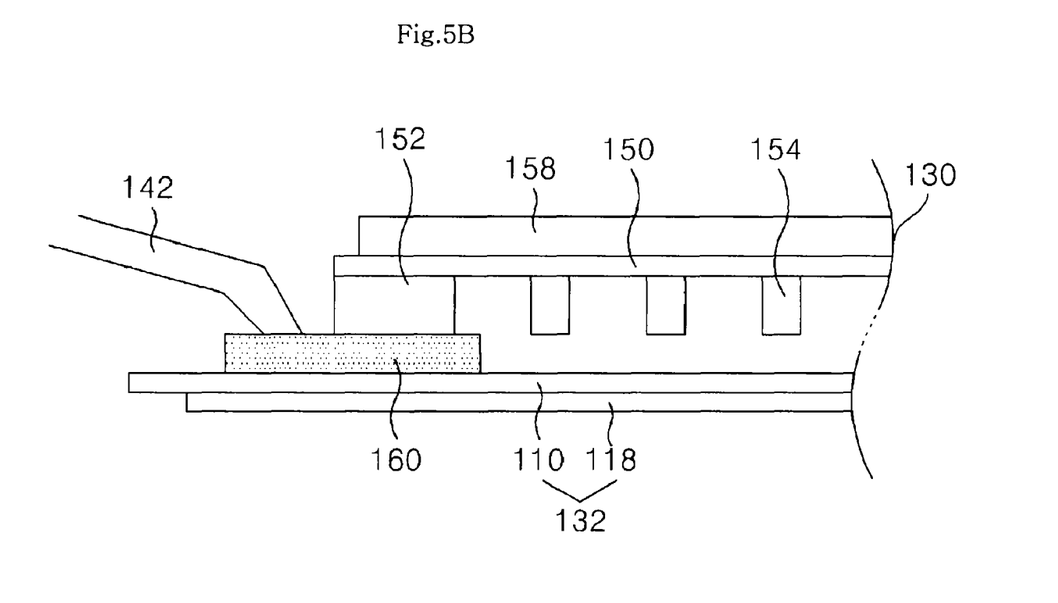
FIG. 5B is a cross-sectional view describing the PDP in accordance with the first embodiment of the present invention.

FIG. 4 is a cross-sectional view showing a film filter suggested in the present invention. FIG. 5A is a perspective view showing a Plasma Display Panel (PDP) in accordance with a first embodiment of the present invention and FIG. 5B is a cross-sectional view describing the PDP in accordance with the first embodiment of the present invention.

Referring to FIG. 4, the structure of the film filter 130 mounted on the PDP will be described. The film filter 130 includes a non-reflective layer 158 formed on a base film 150 toward a display surface and an Electro Magnetic Interference (EMI) shielding film 154 formed toward the non-reflective layer 158 and a panel.

The non-reflective layer 158 is combined with the base film 150 by an adhesive agent (not shown) to prevent lights entering from the outside from being reflected back to the outside and thus improve the contrast of the PDP.

Transparent resin may fill the gaps in the EMI shielding film 154 and the EMI shielding film 154 blocks the EMI emitted from the panel in the front surface.

The EMI shielding film 154 may be formed of a conductive metal mesh filter having a mesh-type pattern or of a sputter filter. The mesh filter and the sputter filter are mere examples and they do not limit the scope of the present invention.

At the edge of the EMI shielding film 154, a filter grounding unit 152 is formed to widen the contact area during grounding.

The filter grounding unit 152 may be formed in the shape of a conductive metal band having a predetermined width.

The film filter 130 of the present invention requires only one base film for each of the conventional EMI shielding film and the non-reflective layer. Thus, the production cost can be reduced and the structure of the film filter can be simplified.

The PDP with the film filter mounted on the panel is shown in FIGS. 5A and 5B.

According to the first embodiment of the present invention, the PDP includes a panel 132 formed by combining an upper substrate 110 and a lower substrate 118, the film filter 130 formed in the front surface of the panel, and a conductive panel grounding unit 160 for grounding the film filter 130 in the upper substrate.

Since the EMI shielding film 154 and the filter grounding unit 152 of the film filter 130 are formed toward the panel 132, the panel grounding unit 160 is formed in the panel to be electrically grounded to the filter grounding unit 152.

The panel grounding unit 160 is formed at the edge of the upper substrate 110, which is the external circumference of an active area, to contact the filter grounding unit 152 of the film filter 130. It is connected to the back cover (not shown) by a grounding unit 142.

The panel grounding unit 160 is formed in the front surface of the panel 132 at a position confronting the filter grounding unit 152 of the film filter 130. The area of the panel grounding unit 160 is formed a bit wider than that of the filter grounding unit 152.

The panel grounding unit 160 is formed at the external circumference of the active area in the front surface of the panel 132. The active area means the external circumferential area of a part of the panel where images are displayed.

The panel grounding unit 160 may be formed in a well-known process. It can be formed by sputtering a conductive substance or it can be formed by coating the edge of the upper substrate with a conductive substance.

The panel grounding unit 160 is electrically connected to the filter grounding unit 152. When the panel 132 is combined with the film filter 130, the filter grounding unit 152 is combined with the panel grounding unit 160 to be grounded.

A heat sink 134 is mounted on the rear surface of the panel 132. The heat sink 134 is combined with a printed circuit board 136.

The heat sink 134 emits heat generated from the panel 132 and the printed circuit board 136.

The printed circuit board 136 provides operation signals to a plurality of electrodes formed in the panel 132. It includes many operation units, which are not shown in the drawings, to provide the operation signals. The panel 132 displays predetermined images in response to the operation signals from the printed circuit board 136.

According to the first embodiment of the present invention, the PDP further includes a back cover (not shown) formed to surround the panel 132 and the grounding unit 142 for electrically connecting the back cover to the panel grounding unit 160.

The back cover is formed to cover the external circumference of the panel, and the grounding unit 142 is formed of a conductive substance and electrically connects the back cover to the panel grounding unit 160.

The EMI blocked by the film filter 130 is transferred through the filter grounding unit 152 and the panel grounding unit 160 and finally exhausted toward the back cover through the grounding unit 142.

Figure 6A:
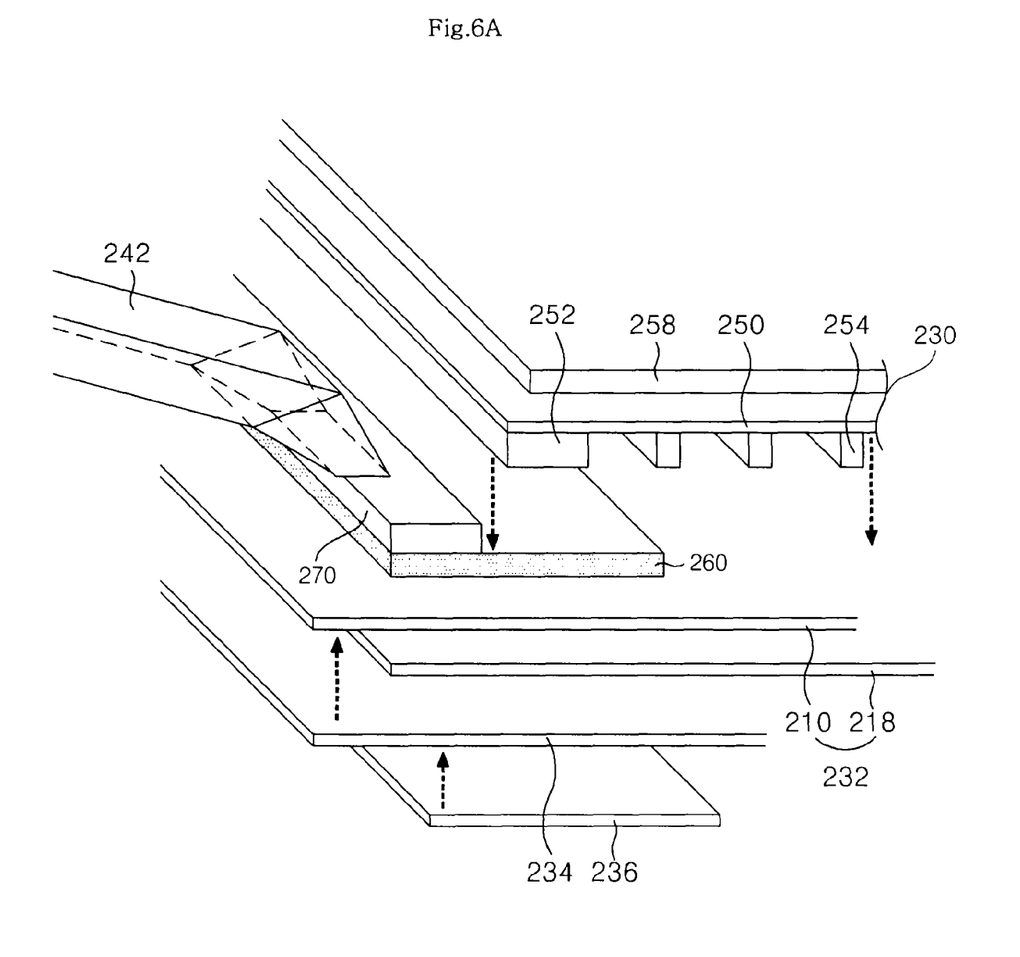
FIG. 6A is a perspective view showing a PDP in accordance with a second embodiment of the present invention.
Figure 6B:
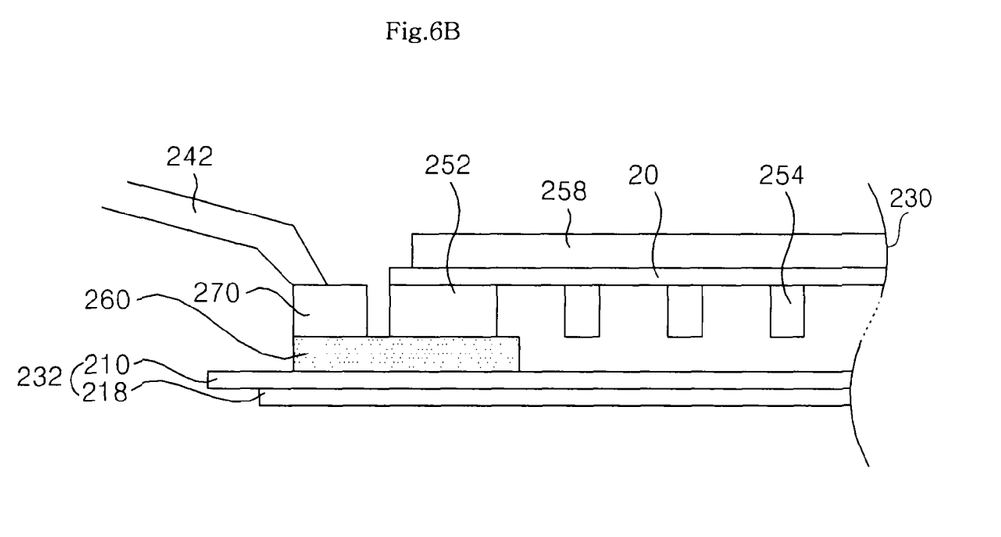
FIG. 6B is a cross-sectional view describing the PDP in accordance with the second embodiment of the present invention.

FIG. 6A is a perspective view showing a PDP in accordance with a second embodiment of the present invention; and FIG. 6B is a cross-sectional view describing the PDP in accordance with the second embodiment of the present invention.

Referring to FIGS. 6A and 6B, the PDP suggested in the second embodiment of the present invention basically has the same structure as that of the first embodiment but it features that a panel grounding unit 260 and a grounding unit 242 are connected through a conductive substance 270.

To describe the structure in detail, the PDP of the second embodiment includes a panel 232, a film filter 230, the conductive panel grounding unit 260, and the conductive substance 270.

The panel 232 is formed by combining an upper substrate 210 with a lower substrate 218. The film filter 230 is mounted on the front surface of the panel 232. The conductive panel grounding unit 260 is formed on the upper substrate 210 to ground the film filter 230. The conductive substance 270 is formed in the panel grounding unit 260.

The panel grounding unit 260 is formed at the edge of the upper substrate 210, which is external circumference of an active area, to contact the film grounding unit 252 of the film filter 230. The panel grounding unit 260 may be formed in a well-known process. It can be formed by sputtering a conductive substance or it can be formed by coating the edge of the upper substrate 210 with a conductive substance.

The panel grounding unit 260 includes the conductive substance 270 formed therein to be electrically connected to a back cover (not shown) through the grounding unit 242.

When the metallic grounding unit 242 directly contacts the metallic panel grounding unit 260 formed in the panel 232, the panel 232 may be damaged by physical strength applied thereto. Therefore, the panel grounding unit 260 includes the conductive substance 270 formed therein to buffer the physical strength of the grounding unit 242.

The conductive substance 270 is formed of a substance having a predetermined elasticity to buffer the impact between the grounding unit 242 and the panel grounding unit 260.

Also, the conductive substance 270 may be formed of a substance having a predetermined level of adhesiveness to improve the adhesiveness between the grounding unit 242 and the panel grounding unit 260.

For example, a conductive tape may be used as the conductive substance 270 having the two properties.

Meanwhile, a heat sink 234 is mounted on the rear surface of the panel 232. The heat sink 234 is combined with a printed circuit board 236. The heat sink 234 emits heat generated from the panel 232 and the printed circuit board 236.

The printed circuit board 236 provides operation signals to the electrodes of the panel 232. It includes many operation units, which are not shown in the drawings, to provide the operation signals. The panel 232 displays predetermined images in response to the operation signals from the printed circuit board 236.

The PDP described above can reduce the production cost by using one base film and it can prevent the panel from being damaged by the grounding unit. In addition, it can improve the grounding force by efficiently grounding the EMI absorbed in the EMI shielding film to thereby increase the EMI shielding rate.

While the PDP of the present invention has been described with reference to the exemplary drawings, it is to be understood that the invention is not limited to the disclosed embodiments or drawings, but, on the contrary, is intended to cover various modifications and equivalent arrangements included within the spirit and scope of the appended claims.

What is claimed is:

1. A Plasma Display Panel (PDP), comprising:
a panel with a panel grounding unit at a front surface thereof;
a back cover surrounding the panel;
a grounding unit for electrically connecting the panel grounding unit to the back cover; and
a film filter positioned in the front of the panel, comprising:
one and only one base film,
an Electro Magnetic Interference (EMI) shielding film positioned on a side of the base film, directed toward the panel, and
a non-reflective layer positioned on the base film on a side opposite of the Electro Magnetic Interference (EMI) shielding film,
wherein the EMI shielding film is formed in a conductive metal mesh type and a transparent resin fills the meshes of the Electro Magnetic Interference (EMI) shielding film,
wherein the non-reflective layer is combined with the base film by an adhesive agent,
wherein the panel grounding unit and the grounding unit are connected through a conductive substance, and
wherein the conductive substance is formed of a substance having a predetermined elasticity to buffer impact between the grounding unit and the panel grounding unit.

2. The PDP as recited in claim 1, wherein the EMI shielding film includes a filter grounding unit formed at the edge.

3. The PDP as recited in claim 2, wherein the panel grounding unit is formed in external circumference of an active area of the front surface.

4. The PDP as recited in claim 3, wherein the filter grounding unit and the panel grounding unit are formed of a conductive metal.

5. The PDP as recited in claim 4, wherein the filter grounding unit and the panel grounding unit are electrically connected.

6. The PDP as recited in claim 5, wherein the grounding unit is formed of a conductive substance.

7. A Plasma Display Panel (PDP), comprising:
- a panel with a panel grounding unit at a front surface thereof;
- a film filter comprising one and only one base film positioned at the front surface of the panel;
- an Electro Magnetic Interference (EMI) shielding film positioned on a side of the base film, directed toward the panel;
- a non-reflective layer formed on the base film on a side opposite of the Electro Magnetic Interference (EMI) shielding film;
- a back cover surrounding the panel; and
- a grounding unit for electrically connecting the panel grounding unit to the back cover,
- wherein the EMI shielding film formed in a conductive metal mesh type and a transparent resin fills the meshes of the EMI shielding film,
- wherein the panel grounding unit and the grounding unit are connected through a conductive substance,
- wherein the non-reflective layer is coupled to the base film by an adhesive agent, and
- wherein the conductive substance is formed of a substance having a predetermined elasticity to buffer impact between the grounding unit and the panel grounding unit.

8. The PDP as recited in claim 7, wherein the conductive substance is a conductive tape.

9. The PDP as recited in claim 7, wherein the EMI shielding film includes a filter grounding unit formed at the edge.

10. The PDP as recited in claim 9, wherein the panel grounding unit is formed in external circumference of an active area in the front surface of the panel.

11. The PDP as recited in claim 10, wherein the filter grounding unit and the panel grounding unit are formed of a conductive metal.

12. The PDP as recited in claim 11, wherein the filter grounding unit and the panel grounding unit are electrically connected.

* * * * *